(12) United States Patent
Ouyang et al.

(10) Patent No.: US 8,095,230 B2
(45) Date of Patent: Jan. 10, 2012

(54) METHOD FOR OPTIMIZING THE ROUTING OF WAFERS/LOTS BASED ON YIELD

(75) Inventors: Xu Ouyang, Hopewell Junction, NY (US); Oleg Gluschenkov, Poughkeepsie, NY (US); Yunsheng Song, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 12/145,025

(22) Filed: Jun. 24, 2008

(65) Prior Publication Data

US 2009/0317924 A1 Dec. 24, 2009

(51) Int. Cl.
*G06F 19/00* (2006.01)
*G01N 37/00* (2006.01)
*H01L 21/00* (2006.01)

(52) U.S. Cl. ............ 700/99; 700/96; 700/108; 700/116; 700/121; 702/82; 438/5

(58) Field of Classification Search .................... 700/96, 700/99, 108–110, 115, 116, 121, 102, 111; 702/82, 187; 451/5; 438/5
See application file for complete search history.

(56) References Cited

U.S. PATENT DOCUMENTS

| | | | |
|---|---|---|---|
| 6,449,522 B1 * | 9/2002 | Conboy et al. | 700/121 |
| 6,586,265 B2 | 7/2003 | Chiou et al. | |
| 6,604,012 B1 * | 8/2003 | Cho et al. | 700/121 |
| 6,929,962 B1 | 8/2005 | Chang | |
| 6,978,187 B1 * | 12/2005 | Ryskoski | 700/100 |
| 7,062,411 B2 | 6/2006 | Hopkins et al. | |
| 7,177,716 B2 | 2/2007 | Duffin et al. | |
| 7,318,206 B2 | 1/2008 | Brendler et al. | |
| 7,767,471 B2 * | 8/2010 | Wang et al. | 438/5 |

* cited by examiner

*Primary Examiner* — Sean Shechtman
(74) *Attorney, Agent, or Firm* — Ian Mackinnon; Roberts Mlotkowski Safran & Cole, P.C.

(57) ABSTRACT

A method for increasing overall yield in semiconductor manufacturing including routing wafers or wafer lots based on process variation data obtained from the wafers or wafer lots and on process variation data obtained from tools processing the wafers or wafer lots. A system for increasing overall yield in semiconductor manufacturing includes a module for routing wafers or wafer lots based on process variation data obtained from the wafers or wafer lots and on process variation data obtained from the tools processing the wafers or wafer lots.

23 Claims, 11 Drawing Sheets

METHOD FOR OPTIMIZING THE ROUTING OF WAFERS/LOTS BASED ON YIELD

FIELD OF THE INVENTION

The invention generally relates to a system and method for optimizing yield in semiconductor manufacturing by routing wafers having at least one low yield characteristic to tools known to produce wafers with a similar low yield characteristic, and routing wafers having at least one high yield characteristic to tools known to produce wafers with a similar high yield characteristic.

BACKGROUND

Advanced semiconductor manufacturing today involves the movements of wafers from start to finish through hundreds of steps. Each step can have multiple choices of tools, chambers, recipes, etc. The processing route(s) for the wafers are determined mainly based on tool availability, i.e., capacity utilization, in order to move wafers as fast as possible through the route and typically occurs without consideration of yield and other factors. However, the routes for processing the wafers or wafer lots are typically not determined by taking into account, to a significant extent, known processing tool signature as well as characteristics of the wafers such as the purpose of the wafers, inline test and measurement results, and defect inspection results, in particular, tool yield signature and wafer yield signature.

FIG. 1 shows an example of different types of processing tools 10-13, 20-23, 30-33 and 40-43 using the same four process steps. In this example, two processing routes R1 and R2 are shown.

In processing route R1, the wafers leaving tool 11 are transferred to tool 21 because tool 21 is either waiting for wafers or has fewer wafers waiting for processing than tools 20, 22 and 23, i.e., the processing route is based on capacity utilization considerations. The wafers leaving tool 21 are transferred to tool 31, and are then transferred from tool 31 to tool 41, for similar reasons, i.e., because tools 31 and 41 are either waiting for wafers or has fewer wafers waiting for processing than, respectively, tools 30, 32 and 33 and tools 40, 42 and 43.

In processing route R2, the wafers leaving tool 12 are similarly transferred to tool 22 because tool 22 is either waiting for wafers or has fewer wafers waiting for processing than tools 20, 21 and 23. The wafers leaving tool 22 are similarly transferred to tool 33 because tool 33 is either waiting for wafers or has fewer wafers waiting for processing than tools 30, 31 and 32, and are then transferred to tool 43 because tool 43 is similarly either waiting for wafers or has fewer wafers waiting for processing than tools 40, 41 and 42.

The above-noted routes are typically not determined by the known process variations of the processing tools. It is known, for example, that some tools generate consistent problems affecting one aspect of the wafers while other tools generate consistent problems affecting other aspects of the wafers. Thus, for example, some etching tools may consistently over etch an edge region of the wafers, while other etching tools under etch a center region of the wafers, or vice versa. Also, some deposition tools may consistently over deposit material in one zone region of the wafers, while other deposition tools under deposit material in another zone region of the wafers, or vice versa. Furthermore, all processing tools drift with time, e.g., their ability to produce wafers with consistent characteristics and dimensions changes. The tools, however, can be re-centered, i.e., brought back to the point that they produce less variability from wafer to wafer or wafer lot to wafer lot. The need for such re-centering is typically determined by numerous considerations such as, e.g., the tool's maintenance schedule and feedback or measurements provided from monitors, processing results, inspection reports, etc.

The problem, however, is that there is usually a time delay between feedback and tool adjustment. For example, most tools are qualified on a 24 hour or longer interval. A shorter qualification interval is however expensive because it typically requires using more monitors and typically requires the non-productive idling of the tool for qualification and awaiting results thereof.

Awaiting feedback from the wafers is even less effective because the data from the wafers is typically not be available in a timely enough manner. Furthermore, performing excessive readjustment of the tool (even when the tool is in the normal statistical controlled specification limit) can also cause too much interruption of the tool, and may even cause chamber instability.

Accordingly, there exists a need in the art to overcome the deficiencies and limitations described herein.

SUMMARY

In a first aspect of the invention, there is provided a method for increasing overall yield in semiconductor manufacturing comprising routing wafers or wafer lots based on process variation data obtained from the wafers or wafer lots and on process variation data obtained from the tools processing the wafers or wafer lots.

In a second aspect of the invention, there is provided a system for increasing overall yield in semiconductor manufacturing comprising a central processing unit (CPU) and a program code for routing wafers or wafer lots based on process variation data obtained from the wafers or wafer lots and on process variation data obtained from tools processing the wafers or wafer lots. The program code is tangibly embodied on medium and processed on the central processing unit.

In a third aspect of the invention, there is provided a method for increasing overall yield in semiconductor manufacturing comprising routing wafers or wafer lots having at least one first yield characteristic to at least one tool having a substantially similar yield characteristic and routing wafers or wafer lots having at least one second yield characteristic to at least one tool having a substantially similar yield characteristic.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
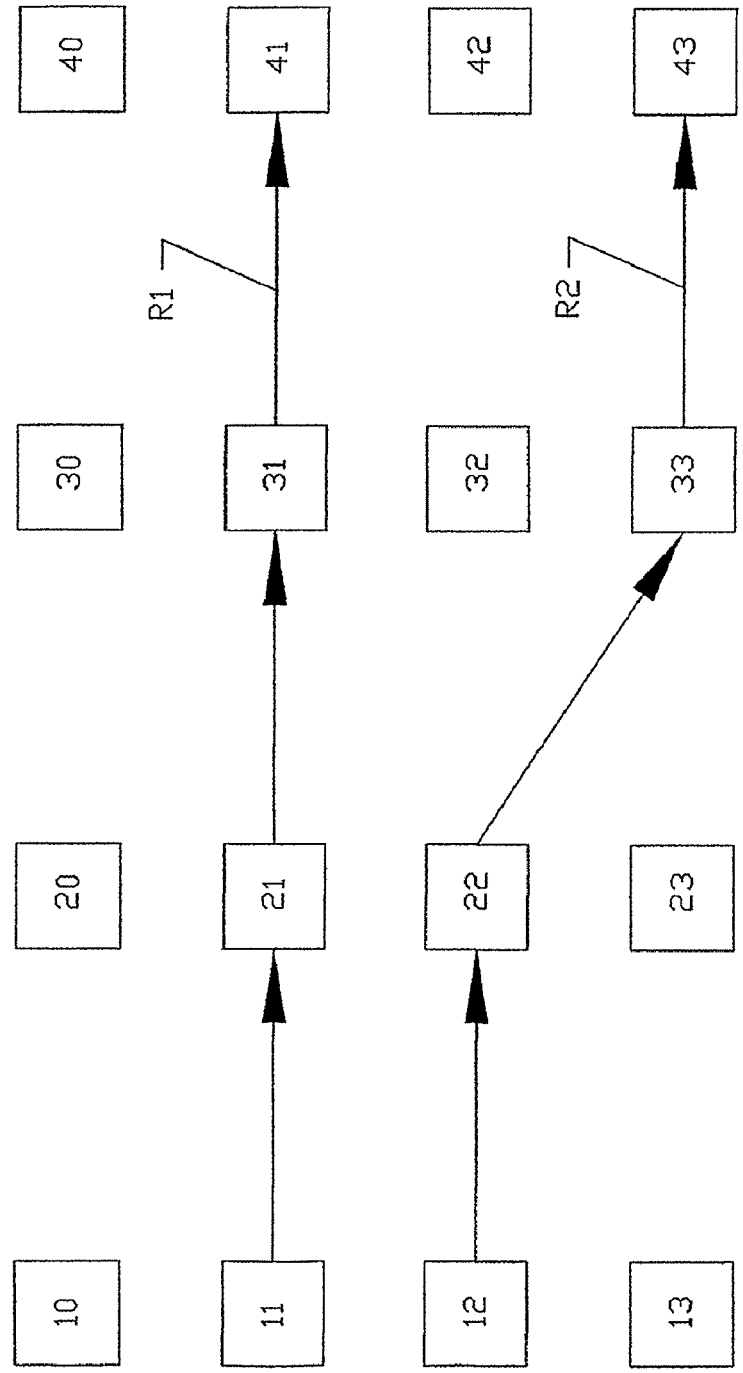
FIG. 1 shows a plurality of different tools and illustrates two routes which wafers or wafer lots can take between the tools.

The invention generally relates to a system and method for increasing overall yield in semiconductor manufacturing by systematically and/or automatically routing wafers having at least one low yield characteristic to tools known to produce wafers with a similar low yield characteristic, and routing wafers having at least one high yield characteristic to tools known to produce wafers with a similar high yield characteristic. In this way, the lower yield wafers can be routed to tools known to produce wafers with lower yield and the higher yield wafers can be routed to tools known to produce wafers with higher yield.

According to the invention, processing tools are qualified as usual. However, a real-time database can be created which records and grades each process tool or chamber based on their mean value of the qualification or device measurement result. For example, recorded values for each tool or chamber can be designated as higher yield or lower yield (e.g., positively or negatively bias) respectively from target means. For each processing route, the inter-relationship of all process steps with respect to target means is evaluated. If the relationship is numerically or yield related, then certain wafers are routed to tools such that higher yield chambers or tools will receive wafers known to have higher yield and certain other wafers are routed to tools such that lower yield chambers or tools will receive wafers known to having lower yield. Furthermore, by obtaining substantially real-time processing data about the tools and/or the wafers or wafer lots, the wafer routing system can be updated as new measurement data is received. The system can also utilize weighting factors in tool pairing as well as a tool pairing algorithm. The system can also take account of new processing data to readjust or update the tool qualification data or results so that the route is determined for the wafers with the latest available processing data for the tools and for the wafers or wafer lots.

The invention takes account of the fact that in many of the process steps, some tools or chambers or their combinations may cause wafers processed through them to have lower yield in a certain period of time. Thus, the invention provides that a wafer/lot with lower yield based on inline tests may be chosen to go through a set of lower-yielding tool/chamber combinations, while a wafer/lot with higher yield based on inline tests may be chosen to go through a set of higher-yielding tool/chamber combinations. This is based on the notion of clustering effect in yield modeling, i.e., because a chip cannot be killed twice, the absolute yield loss from the same bad tool/chamber should be much less on a bad lot than on a good lot. The route optimization method of the invention should therefore provide a higher average yield of good and bad lots. Furthermore, according to the invention, the "in situ" route can be changed/selected based on tests performed on the wafers as they move through the fabrication facility. This results in a type of yield-based: route optimization. The same methodology may also be applied to optimize performance, or combinations of yield, performance, and cycle time.

According to another aspect of the invention, there is provided a method and system to improve overall wafer yield across the fabrication facility by intelligently choosing or changing the processing routes of wafers or wafer lots in the production lines based on inline measurements on the wafer/lot and based on tool rankings. The processing route typically includes various tools or chambers or combinations, some of which are known to correspond to higher yield and some to lower yield. The decision(s) to change routes can happen "in situ", after each inline inspection/testing/measuring and can take account of metrology, PLY, or other testing, while wafers are moving along the production line(s). A tool portfolio database can be utilizes and can be dynamically updated to rank all tools and chambers in the facility by their yield performance. The system and method can also utilize spatial signature matching to further improve overall yield by matching wafers with regional low yield characteristics or problems to tools or chambers with similar regional characteristics or problems. Besides yield, other metrics such as performance, reliability, etc., can be used to change the route of the wafers or wafer lots.

According to another aspect of the invention, there is provided a tool portfolio database which can store multiple processing data types. The multiple data types can be used to built a tool portfolio database which can rank tools for each process step by using tool quality index. A chamber database can also be established in same way.

Figure 2:
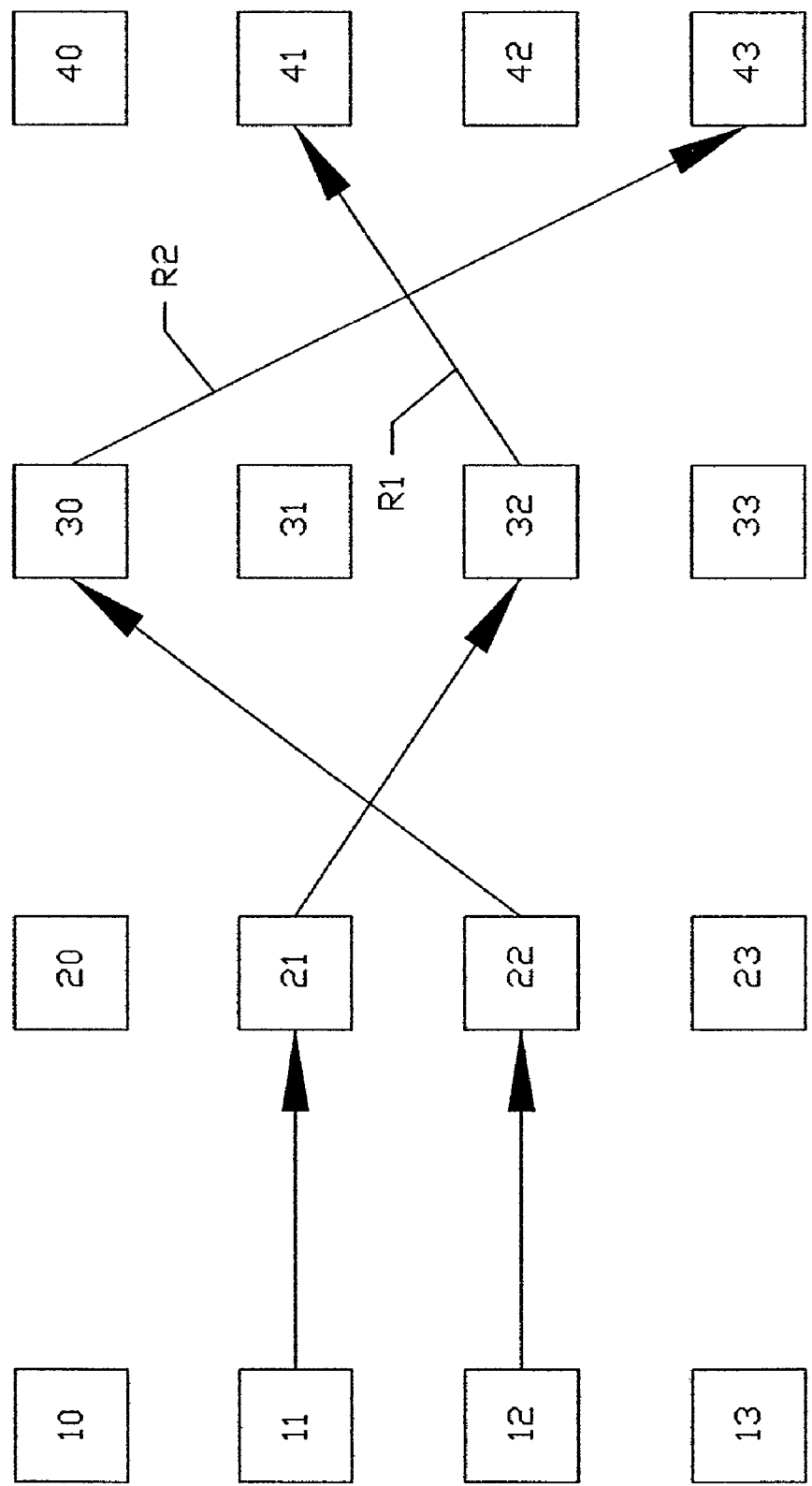
FIG. 2 shows a plurality of different tools and illustrates two exemplary routes which wafers or wafer lots can take between the tools in accordance with the invention.

FIG. 2 shows a non-limiting example of the invention. As was the case in FIG. 1, different types of processing tools 10-13, 20-23, 30-33 and 40-43 utilized. In this example of the invention, only two processing routes R1 and R2 are shown to illustrate the invention. In processing route R1, the wafers leaving tool 11 are transferred to tool 21 because tool 21 is either processing wafers close to nominal (assuming tool 11 is also substantially nominal) or because the tool 21 comes closest to processing the wafers in the same way as tool 11 and/or otherwise comes closest to matching the yield of the wafers or lots leaving tool 11, and is otherwise available. For example, if tool 11 is a higher yield tool, and tool 21 produces higher yield whereas tools 20, 22 and 23 produce lower yield, tool 21 is the best choice of tools 20-23. Of course, if tool 21 was down for, e.g., maintenance, the closest other tool of the group 20-23 could be chosen. Furthermore, the determination can also take into account the capacity utilization of the tools 20-23, so that all of the wafers or wafer lots are not mindlessly directed to one or few tools, thereby creating a bottleneck.

Again with reference to FIG. 2, the wafers leaving tool 21 are transferred to tool 32, and are then transferred from tool 32 to tool 41, for similar reasons. For example, tool 32 can be selected for the route RI because tool 32 is either processing wafers close to nominal (assuming tool 21 is also substantially nominal) or because the tool 32 comes closest to processing the wafers in the same way as tool 21 (or possibly also tool 11) and/or otherwise comes closest to matching the yield of the wafers or lots leaving tool 21, and is otherwise available. Furthermore, tool 41 is selected for route RI because tool 41 is either processing wafers close to nominal (assuming tool 32 is also substantially nominal) or because the tool 41 comes closest to processing the wafers in the same way as tool 32 (or possibly also tools 21 and 11) and/or otherwise comes closest to matching the yield of the wafers or lots leaving tool 32, and is otherwise available. Again, if tools 32 and 41 were down for, e.g., maintenance, the closest other tool of the groups 30-33 and 40-43 could be chosen. Furthermore, capacity utilization can also be taken into account in determining which downstream tools to send the wafers or wafer lots, as long as the determination at least partially takes into account the known process variation(s) of the tools and/or of the wafers or wafer lots.

In processing route R2, the wafers leaving tool 12 are similarly transferred to tool 22 because tool 22 is either processing wafers close to nominal (assuming tool 12 is also substantially nominal) and/or because the tool 22 comes closest to processing the wafers in the same way as tool 21 and/or otherwise comes closest to matching the yield of the wafers or lots leaving tool 12, and is otherwise available. Of course, if tool 22 was down for, e.g., maintenance, the closest other tool of the group 20-23, could be chosen. Again, the determination can also take into account the capacity utilization of the tools 20-23 so that all of the wafers or wafer lots are not mindlessly directed to one or few tools thereby creating a bottleneck.

Again with reference to FIG. 2, the wafers leaving tool 22 are transferred to tool 30, and are then transferred from tool 30 to tool 43, for similar reasons. For example, tool 30 can be selected for the route R2 because tool 30 is either processing wafers close to nominal (assuming tool 22 is also substantially nominal) or because the tool 30 comes closest to processing the wafers in the same way as tool 22 and/or otherwise comes closest to matching the yield of the wafers or lots leaving tool 22 (or possibly also tool 12), and is otherwise available. Furthermore, tool 43 is selected for route R2 because tool 43 is either processing wafers close to nominal (assuming tool 30 is also substantially nominal) or because the tool 43 comes closest to processing the wafers in the same way as tool 30 and/or otherwise comes closest to matching the yield of the wafers or lots leaving tool 30 (or possibly also tools 22 and 12), and is otherwise available. Again, if tools 30 and 43 were down for, e.g., maintenance, the closest other tool of the groups 30-33 and 40-43 could be chosen. Again, capacity utilization can also be taken into account in determining which downstream tools to send the wafers or wafer lots, as long as the determination at least partially takes into account the known process variation(s) of the tools and/or of the wafers or wafer lots.

Figure 3:
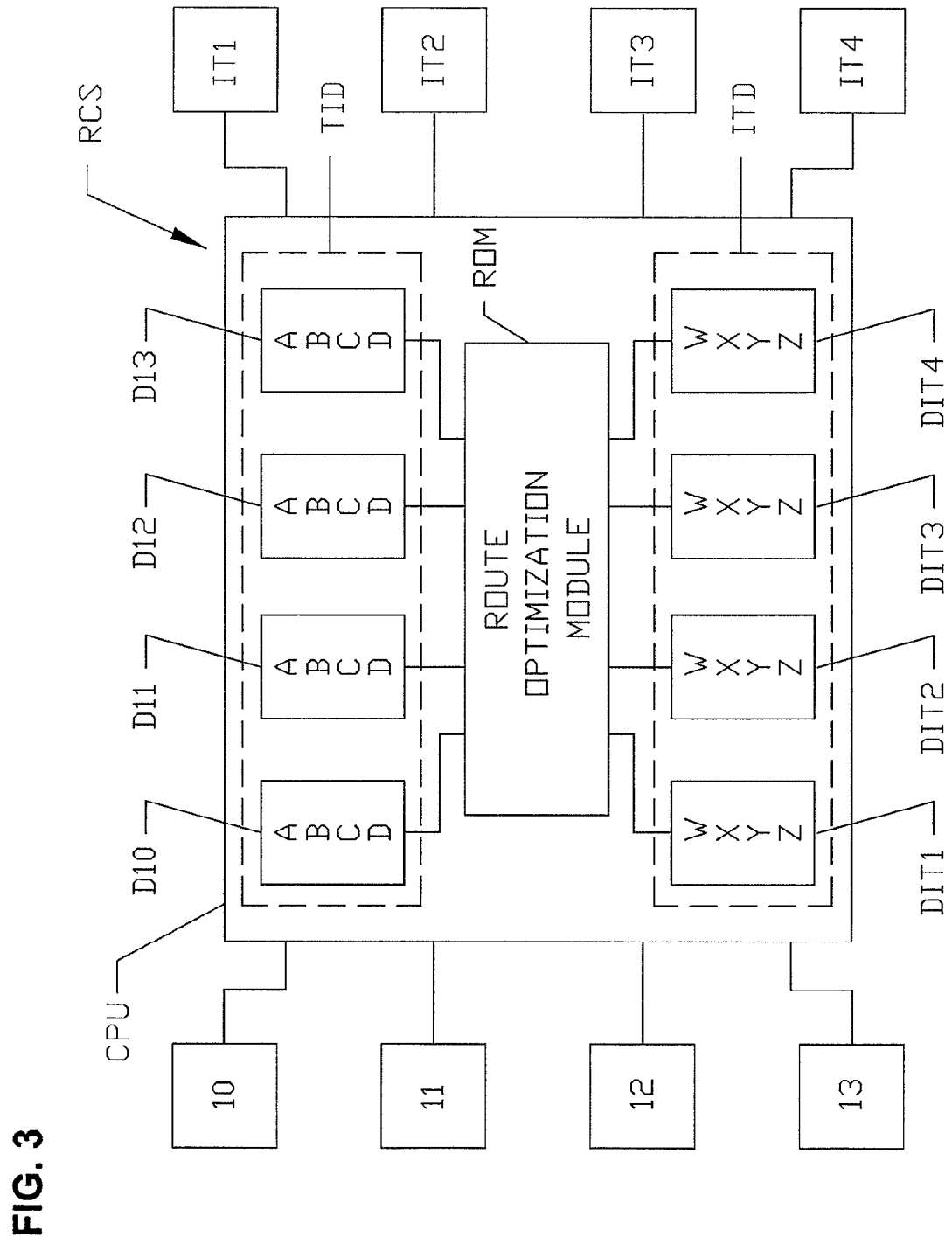
FIG. 3 shows an exemplary route control system in accordance with the invention.

FIG. 3 shows a non-limiting example of a route control system (RCS) in accordance with the invention. The RCS is preferably implemented on hardware (including a central processing unit (CPU)) running software (one or more programs running on the CPU), and includes a plurality of databases D10-D13 which can be organized as a first tool type information database module TID. Database D10 stores processing data from tool 10, database D11 stores processing data from tool 11, database D12 stores processing data from tool 12, and database D13 stores processing data from tool 13. Of course, the system RCS would also have similar databases for tools 20-23, 30-33 and 40-43, etc.

The processing data in databases D10-D13 can be represented by letters A-D in FIG. 3 and can correspond to measured or otherwise recorded processing or yield data from each processing tool 10-13. For example, if the tool 10 is a material removing tool, e.g., an etching tool, data A can be indicative of the etching value over (−) or under (+) nominal (i.e., a predetermined desired value or range for material removal) for an edge area of the wafers. Data B can be indicative of the etching value over (−) or under (+) nominal for a center area of the wafers. Data C can be indicative of the etching value over (−) or under (+) nominal for a particular zone area of the wafers. Data D can be indicative of the etching value over (−) or under (+) nominal for another different zone area of the wafers.

If, for example, the tool 10 is a material adding tool, e.g., a deposition tool, data A can be indicative of the thickness value over (+) or under (−) nominal (i.e., a predetermined desired value or range for material or layer thickness) for an edge area of the wafers. Data B can be indicative of the thickness value over (+) or under (−) nominal for a center area of the wafers. Data C can be indicative of the thickness value over (+) or under (−) nominal for a particular zone area of the wafers. Data D can be indicative of the thickness value over (+) or under (−) nominal for another different zone area of the wafers.

By way further example, data A can be indicative of a processing value over (+) or under (−) nominal (i.e., a predetermined desired value or range) for one wafer lot. Data B can be indicative of the value or range over (+) or under (−) nominal for another wafer lot. Data C can be indicative of the value or range over (+) or under (−) nominal for still another wafer lot. Data D can be indicative of the value or range over (+) or under (−) nominal for still another different wafer lot. The data A-D can thus be used to determine by, e.g., averaging, the typical range of variation for each tool 10-13.

Again, with reference to FIG. 3, the system RCS also includes a plurality of databases DIT1-DIT4 which can be organized as a measurement/testing data information database module (ITD). Database DIT1 stores measurement/testing data from measurement/testing station IT1. Database DIT2 stores measurement/testing data from measurement/testing station IT2. Database DIT3 stores measurement/testing data from measurement/testing station IT3 Database DIT4 stores measurement/testing data from measurement/testing station IT4.

The processing data of databases DIT1-DIT4 can be represented by letters W-Z in FIG. 3 and can correspond to measured or otherwise recorded processing data from each station IT1-IT4, i.e., measurement/testing stations arranged downstream from tools 10-13. For example, if the tools 10-13 are material removing tools, e.g., an etching tool, data W can be indicative of the etching value over (−) or under (+) nominal (i.e., a predetermined desired value or range for material removal) for an edge area of the wafers. Data X can be indicative of the etching value over (−) or under (+) nominal for a center area of the wafers. Data Y can be indicative of the etching value over (−) or under (+) nominal for a particular zone area of the wafers. Data Z can be indicative of the etching value over (−) or under (+) nominal for another different zone area of the wafers.

If, for example, the tools 10-13 are material adding tools, e.g., a deposition tool, data W can be indicative of the thickness value over (+) or under (−) nominal (i.e., a predetermined desired value or range for material or layer thickness) for an edge area of the wafers. Data X can be indicative of the thickness value over (+) or under (−) nominal for a center area of the wafers. Data Y can be indicative of the thickness value over (+) or under (−) nominal for a particular zone area of the wafers. Data Z can be indicative of the thickness value over (+) or under (−) nominal for another different zone area of the wafers.

By way further example, data W can be indicative of a processing value over (+) or under (−) nominal (i.e., a predetermined desired value or range) for one wafer lot. Data X can be indicative of the value or range over (+) or under (−) nominal for another wafer lot. Data Y can be indicative of the value or range over (+) or under (−) nominal for still another wafer lot. Data Z can be indicative of the value or range over (+) or under (−) nominal for still another different wafer lot. The data W-Z can thus be used to determine by, e.g., averaging, the typical range of variation for each tool 10-13.

Again, with reference to FIG. 3, the system RCS also includes a route optimizing module (ROM) which can match downstream tools to upstream tools based on yield and/or match wafers or wafer lots to downstream tools based on yield. The ROM can accesses the data A-D from the database module for the tools 10-13 and the data W-Z from the database module for the wafers or wafer lots (as well as data from tools 20-23, 30-33 and 40-43 in FIG. 2, and preferably including data from all processing tools). The module ROM can perform a number of functions with the data. For example, the module ROM can compare the processing data from the tools 10-13 to the processing data of one or more of the tools 10-13, e.g., tool 12 in FIG. 2, and select one of the tools 20-23, e.g., tool 22 in FIG. 2, based, at least in part, on whether it comes closest to processing the wafers in the same way as tool 12 and/or otherwise comes closest to matching the yield of the wafers or lots leaving tool 12, and is otherwise available. This information can then be used to route wafers or wafer lots from tool 12 to tool 22 (see FIG. 2).

Figure 4:
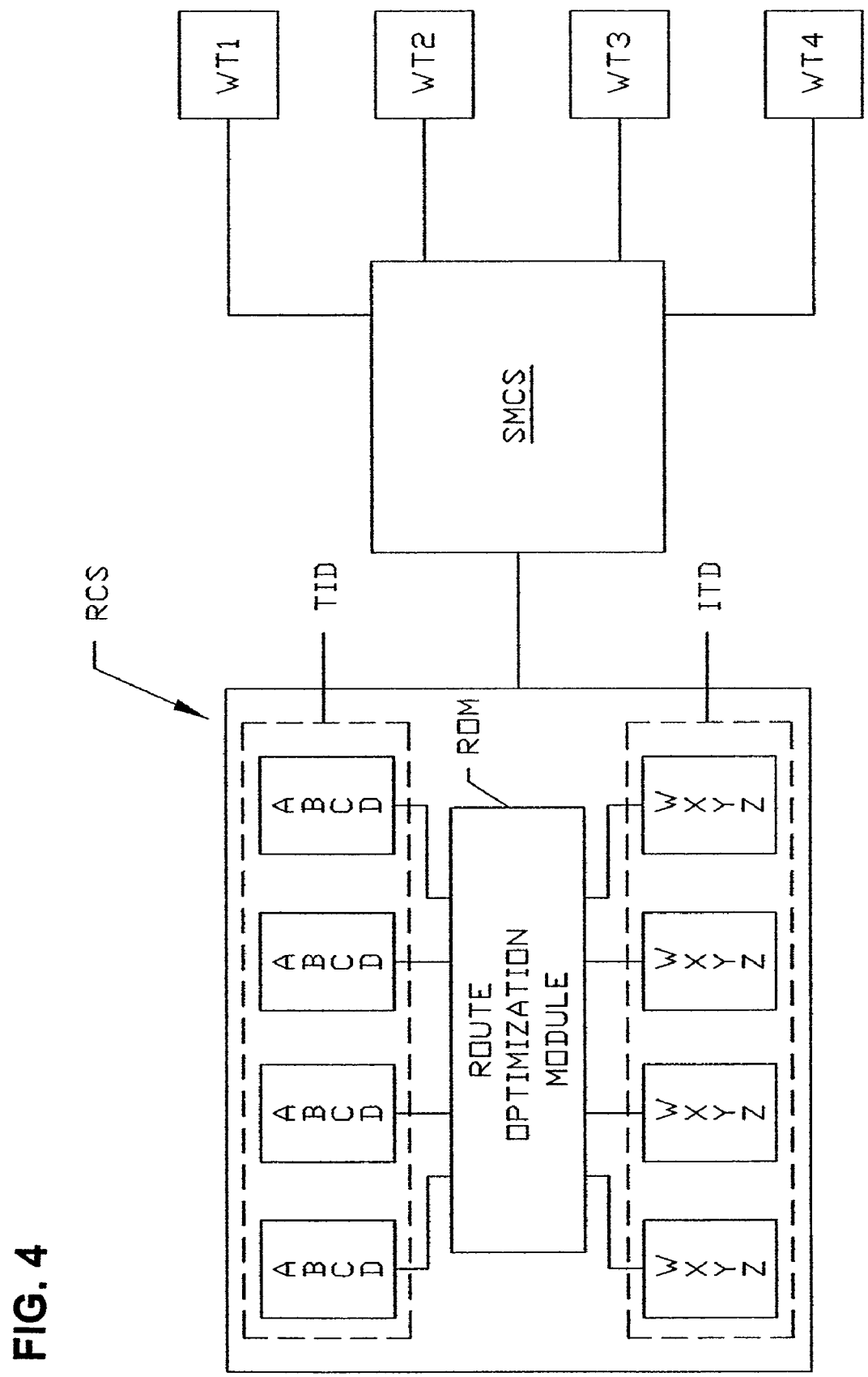
FIG. 4 shows an exemplary semiconductor manufacturing computer system in communication with the route control system and a plurality of wafer transporting devices.

FIG. 4 shows a non-limiting example of the route control system RCS being in communication with and/or electrically connected to the semiconductor manufacturing control system (SMCS). This allows the routing information obtained by the system RCS to be used by the SMCS to control each of the wafer transport devices WT1-WT4 so that the wafers or lots can be routed automatically and in a seamless manner under the overall control of the system SMCS. By way of non-limiting example, the transport devices WT1-WT4 can transport the wafers or wafer lots between the tools 10-13 and tools 40-43 via routes R1 and R2 (see FIG. 3).

Figure 5:
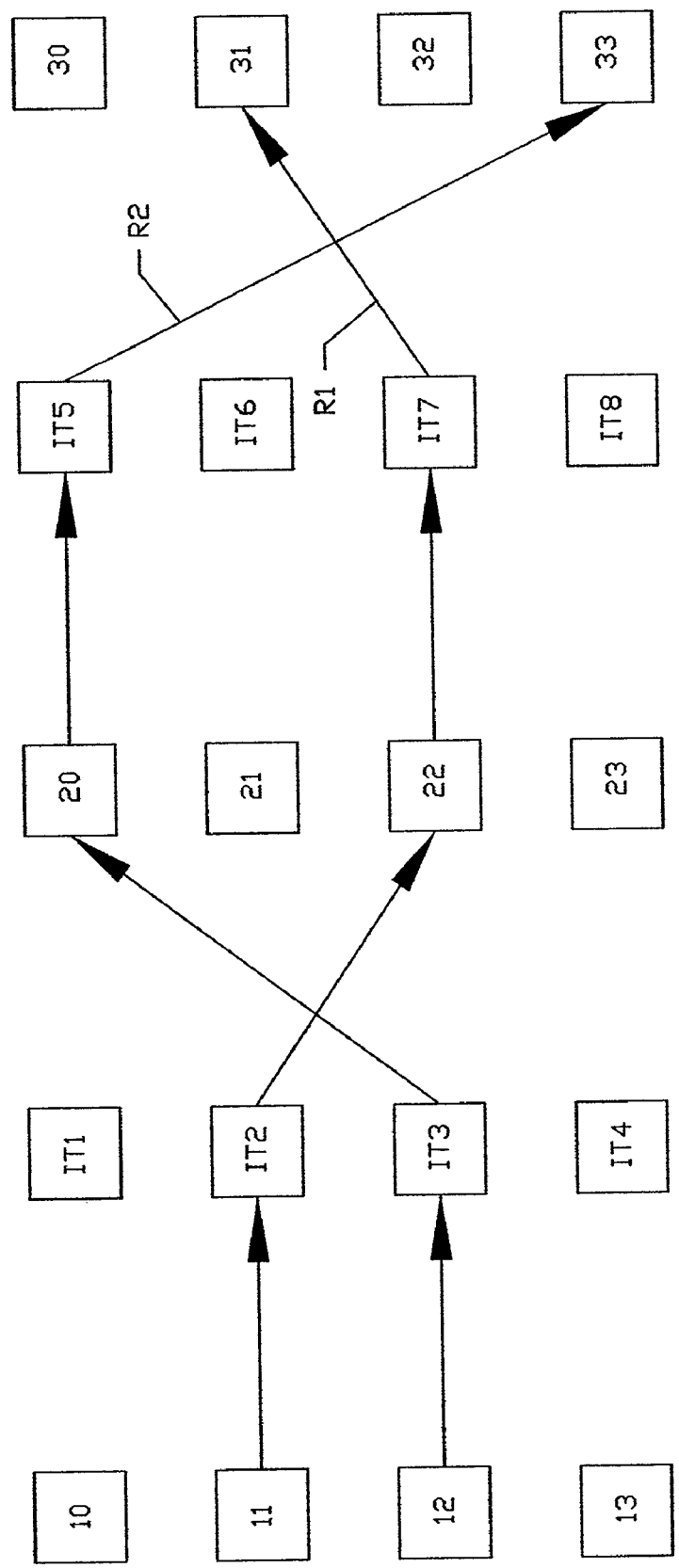
FIG. 5 shows a plurality of different tools and testing/measurement stations, and illustrates two exemplary routes which wafers or wafer lots can take between the tools and testing/measurement stations in accordance with the invention.

FIG. 5 shows another non-limiting example of the invention. As was the case in FIG. 2, different types of processing tools 10-13, 20-23 and 30-33 are utilized. However, in this embodiment, first and second measuring/testing stations IT1-IT4 and IT5-IT8 are utilized to obtain processing and/or yield data between processing toots. In this example of the invention, only two processing routes R1 and R2 are shown to illustrate the invention. In processing route R1, the wafers leaving tool 11 are transferred to station IT2 to obtain real-time data for tools 10-13 from the wafers or wafer lots leaving the tools 10-13. This data is then utilized to determine which tool, e.g., tool 22, to transfer the wafers to in a manner similar to that described above with regard to FIGS. 2 and 3. Since the stations IT1-IT4 do not process the wafers or wafer lots, routing to these stations from tools 10-13 can take place based on capacity utilization. Similarly, the wafers leaving tool 22 are transferred to station IT7 to obtain real-time data for tools 20-23 from the wafers or wafer lots leaving the tools 20-23. This data is then utilized to determine which tool, e.g., tool 31, to transfer the wafers to in a manner similar to that described above with regard to FIGS. 2 and 3. Since the stations IT5-IT8 do not process the wafers or wafer lots, routing to these stations from tools 20-23 can take place based on capacity utilization. Route R2 would take place in a similar manner with the wafers or wafer lots being transferred from tool 12, to station IT3 based on capacity, then to tool 20 based on yield matching, then to station IT5 based on capacity, and then to tool 33 based on yield matching.

Figure 6:
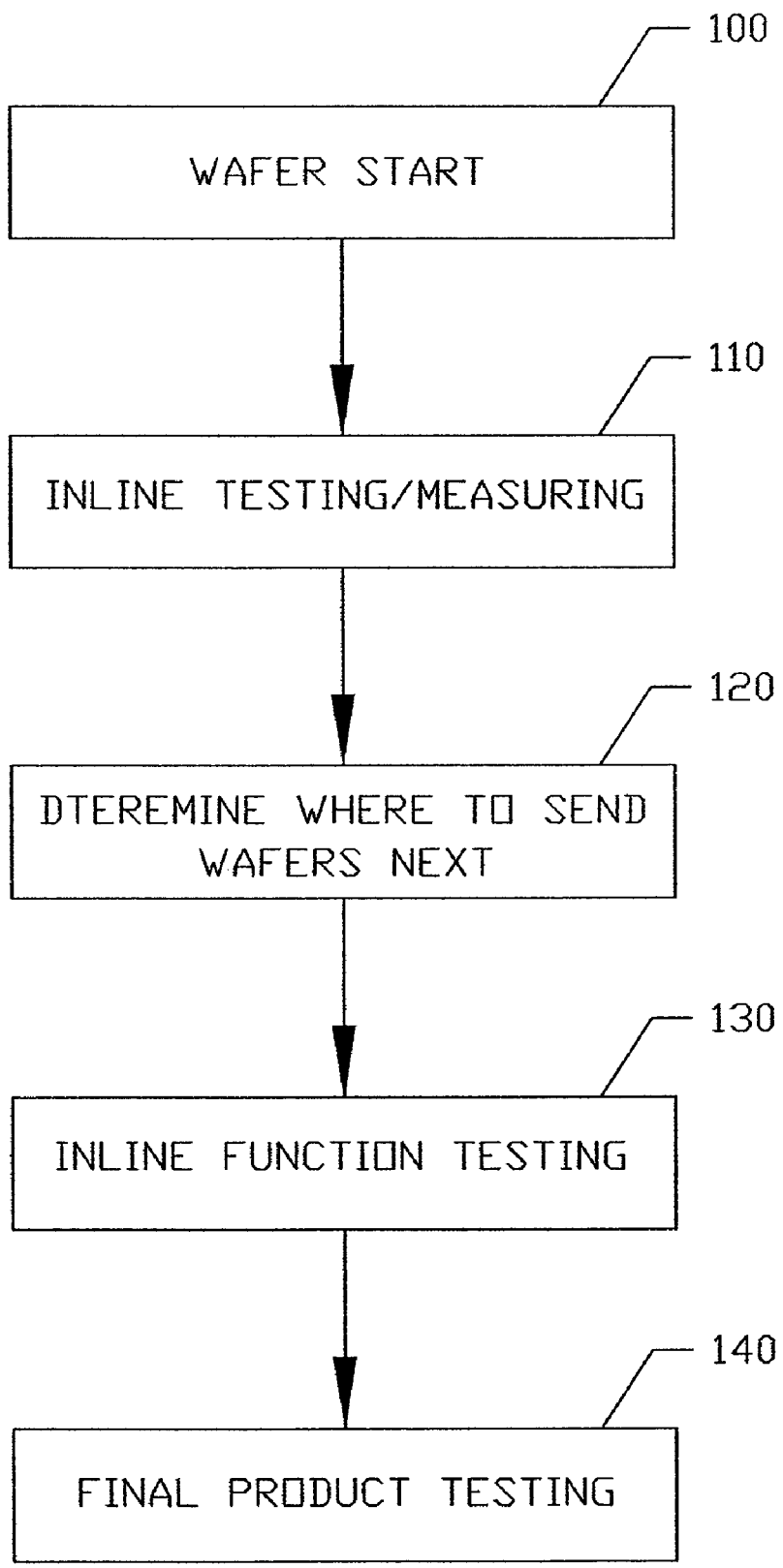
FIG. 6 shows a non-limiting process of routing the wafers or wafer lots in accordance with the invention.
Figure 8:
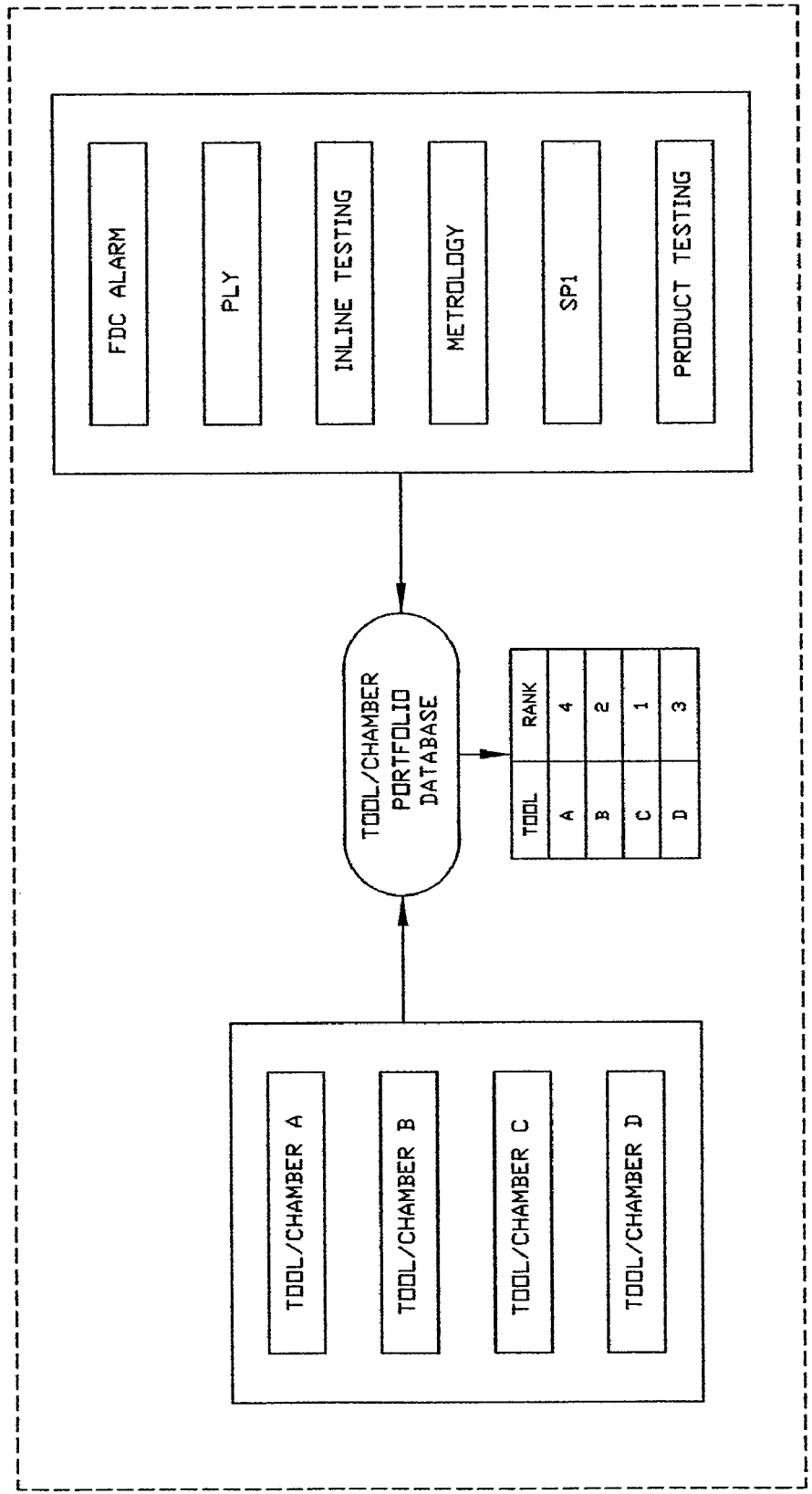
FIG. 8 shows another information system which can be utilized to determine the wafer processing route in accordance with the invention.
Figure 9:
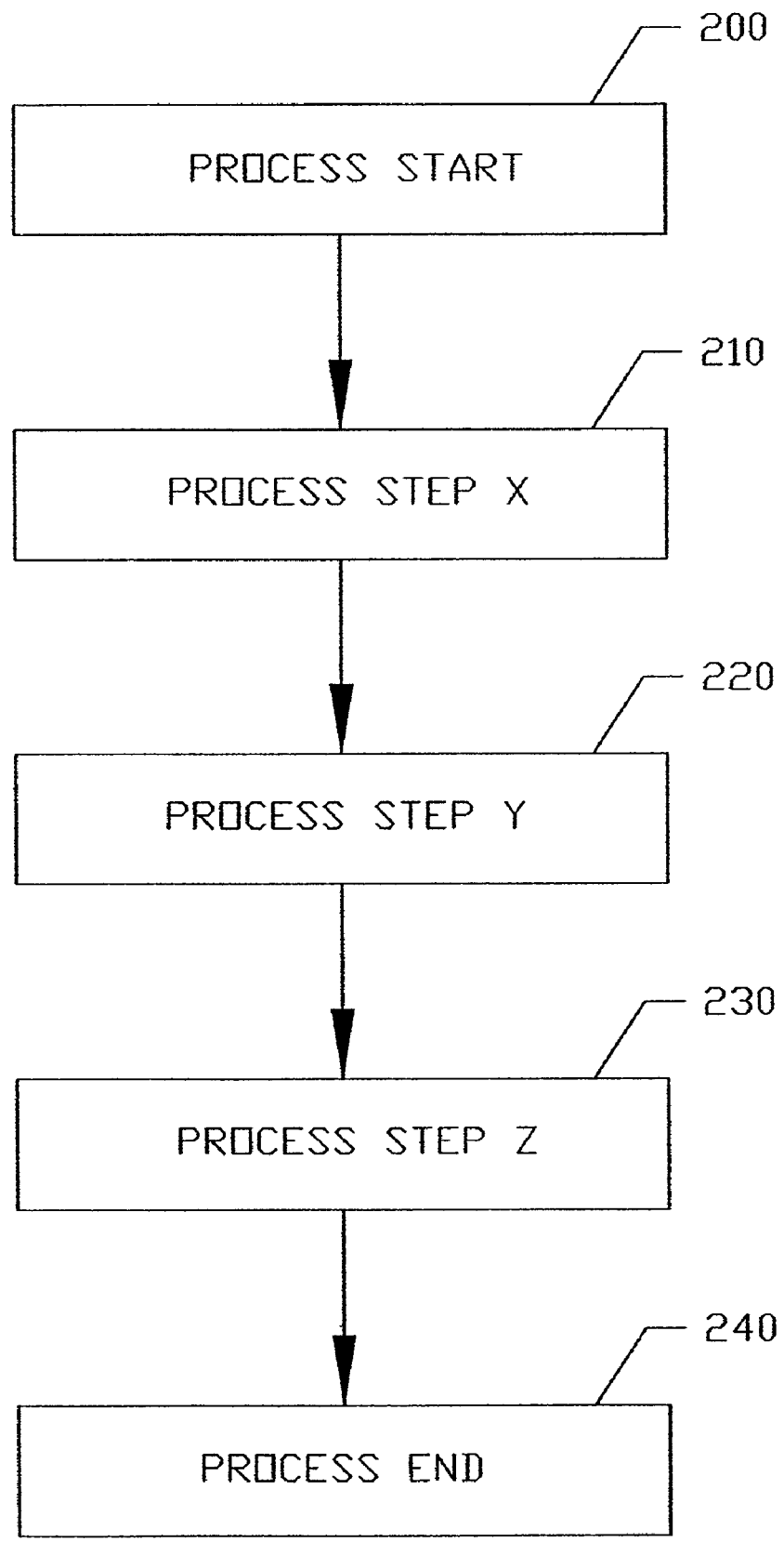
FIG. 9 shows another non-limiting process of routing the wafers or wafer lots in accordance with the invention.

FIGS. 6 and 9 show flow diagrams implementing aspects of the invention. The steps of the flow diagrams described herein may be implemented in the environment of FIGS. 1-5, 7, 8, 10 and 11. The flow diagrams may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1-5, 7, 8, 10 and 11. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

FIG. 6 shows a non-limiting process of routing wafers or wafer lots in accordance with the invention. In step 100, the wafers or wafer lots are made ready for processing in a semiconductor manufacturing facility. Next, the wafers or wafer lots are processed in a first type of tools and subjected to processing which can be any type of wafer process such as etching, deposition, etc,. Next, in step 110, the wafers or wafer lots are subjected to inspection, measurement and/or testing to obtain yield data from the wafers or lots. During this stage, yield data is provided to the system shown in FIGS. 3 and/or 4 as well as FIGS. 7 and/or 8. Next, in step 120, a determination is made where next to send or transfer the wafers or wafer lots. During this stage, the system shown in FIGS. 3 and/or 4 as well as FIGS. 7 and/or 8 can be utilized. Next, the wafers or wafer lots are transferred, based on step 120, to the second type of tools for further processing. Once the wafers or wafer lots are processed, they are subject to functional inspection, measurement and/or testing to obtain yield data from the wafers or lots. During this stage, yield data is provided to the system shown in FIGS. 3 and/or 4 as well as FIGS. 7 and/or 8. Finally, the wafers or wafer lots are subjected to final testing in step 140 where they preferably have increasing overall yield because the wafers were automatically routed in a manner which matches lower yield wafers to lower yield tools/chambers and higher yield wafers to higher yield tools/chambers.

Figure 7:
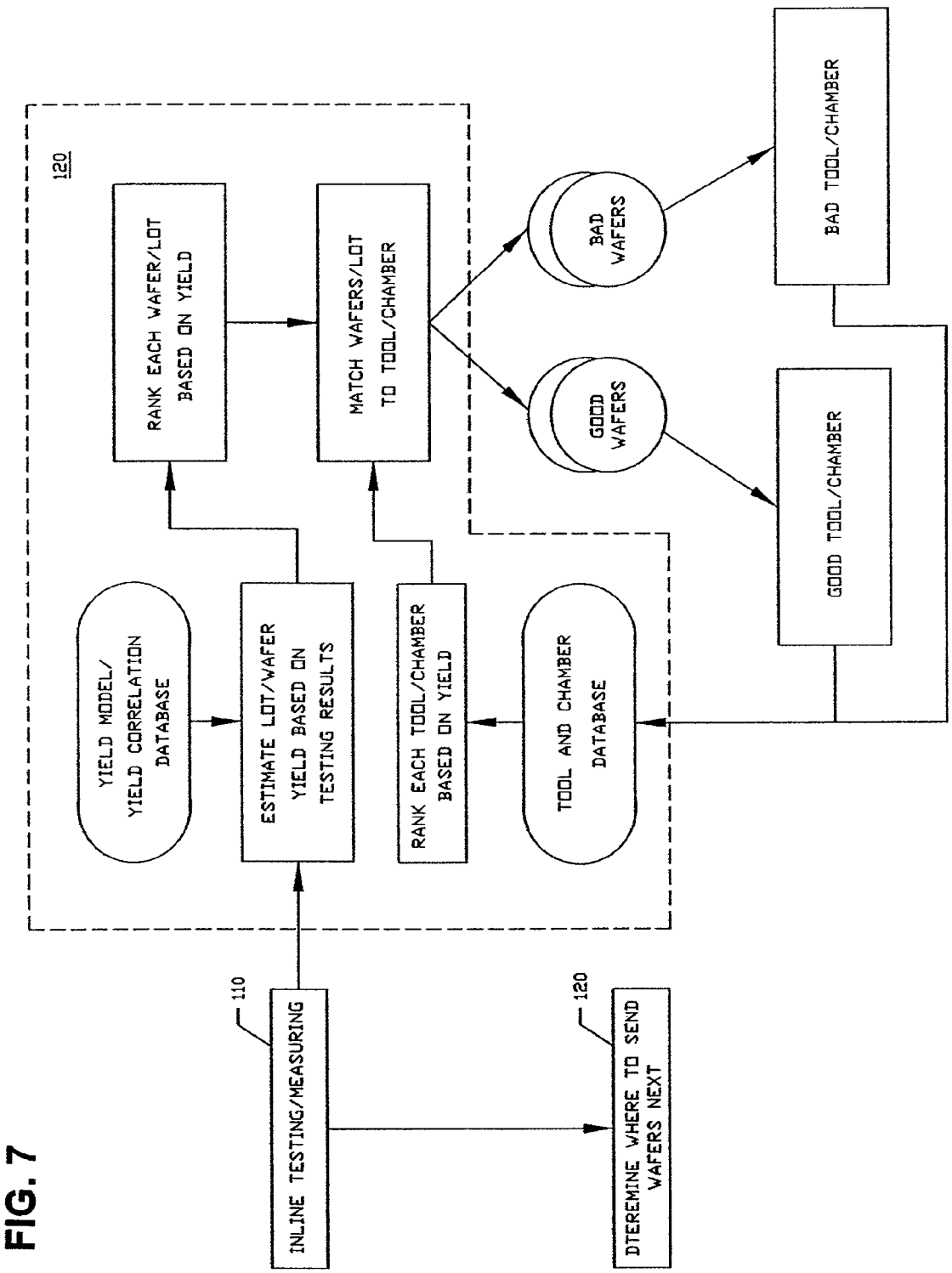
FIG. 7 shows an information system which can be utilized to determine the wafer processing route in accordance with the invention.

FIG. 7 illustrates in detail process steps 110 and 120 of FIG. 6 and shows how data from step 110 is processed in step 120 (the devices/steps arranged within the dashed line represents the various devices/steps which take place in process step 120) to ensure that wafers having what is determined to be good yield are directed to a tool and/or chamber which produces wafers determined to have good yield, and also ensures that wafers having what is determined to be bad yield are directed to a tool and/or chamber which produces wafers determined to have bad yield. Step 120 utilizes a yield model/yield correlation database which can store, among other things, data about the wafers/lots obtained before being processed in step 110 and which compares this data to stored process control data so that this database can produce and provide yield data. A module which estimates lot/wafer yield based on testing results receives testing/measurement data from step 110 and data from the yield model database and estimates the wafer/lot yield. This data is forwarded to a module which ranks each wafer/lot based on yield.

Again with reference to FIG. 7, step 120 also utilizes a tool and chamber database which can store, among other things, yield data about the tools and chambers obtained. This data is preferably real-time data and/or the latest available data indicative of how the tool or chamber is processing the wafers relative to desired processing constraints, and is compared to stored process control data so that this database can produce and provide yield data for each tool and chamber. A module then ranks each tool and/or chamber based on the data received from the tool and chamber database. Along with the data from the module which ranks each wafer/lot based on yield, this data is forwarded to a module which matches wafers or wafers lots to each tool or chamber. The wafers or wafer lots are matched as follows; wafers or wafer lots determined to have good or higher yield are identified so that they can be forwarded to a tool known to produce wafers with good or higher yield, and the wafers or wafer lots determined to have bad or lower yield are identified so that they can be forwarded to a tool known to produce wafers with bad or lower yield. In this way, the overall yield of the wafers will increase because the wafers are automatically routed in a manner which matches lower yield wafers to lower yield tools/chambers and higher yield wafers to higher yield tools/chambers.

FIG. 8 illustrates in detail a modified or optional version of process step 120 of FIG. 6 and shows a database storing data for each tool and/or chamber and a database storing data about each type of measurement and testing condition for the wafers or wafer lots. This data is utilized by a tool and chamber portfolio database which produces a ranking for each of the tools and/or chambers. In the example of FIG. 8, tool A has a rank of "4" which can be indicative of lower yield. Tool B has a rank of "2" which can be indicative of higher yield. Tool C has a rank of "1" which can be indicative of higher yield and tool D has a rank of "3" which can be indicative of lower yield. Wafers or wafer lots which are determined to have similar ranking values or which are simply designated as either lower yield or higher yield, can be routed to the ranked tools. Furthermore, as the data about the tools is updated and/or changes, the ranking will change so that a lower yield tool at one point in time may be a higher yield tool at another point in time and vice versa.

FIG. 9 shows another non-limiting process of routing wafers or wafer lots in accordance with the invention. In step 200, the wafers or wafer lots are made ready for processing in a semiconductor manufacturing facility. Next, in step 210, wafers or wafer lots are processed in a first type of tools and subjected to process X which can be any type of wafer process such as etching, deposition, etc,. Before step 220, information from in-process measuring stations or devices can be obtained from the wafers or wafer lots, and is supplied to an inline/real-time wafer/lot measurement database. Next, a determination is made where to send or transfer the wafers or wafer lots leaving the tools implementing process X by matching wafers from the tools of process X to the tools of process Y. During this stage, the system shown in FIGS. 3 and/or 4, FIGS. 7 and 8, as well as FIGS. 10 and/or 11 can be utilized. Next, the wafers or wafer lots are transferred to the second type of tools implementing process Y and are processed in step 220. Again, information from in-process measuring stations or devices can be obtained from the wafers or wafer lots after step 220, and is supplied to an inline/real-time wafer/lot measurement database. Next, a determination is made where to send or transfer the wafers or wafer lots leaving the tools implementing process Y by matching wafers from the tools of process Y to the tools of process X (similar to step 120 in FIG. 6). During this stage, the system shown in FIGS. 3 and/or 4, FIGS. 7 and 8, as well as FIGS. 10 and/or 11 can be utilized. Next, the wafers or wafer lots are transferred to the third type of tools implementing process Z and are processed in step 230. Additional processing can then occur similar to step 210-240. Once the wafers or wafer lots are processed, they are subject to final testing in step 240 where they preferably have increasing overall yield because the wafers were automatically routed in a manner which matches lower yield wafers to lower yield tools/chambers and higher yield wafers to higher yield tools/chambers.

Figure 10:
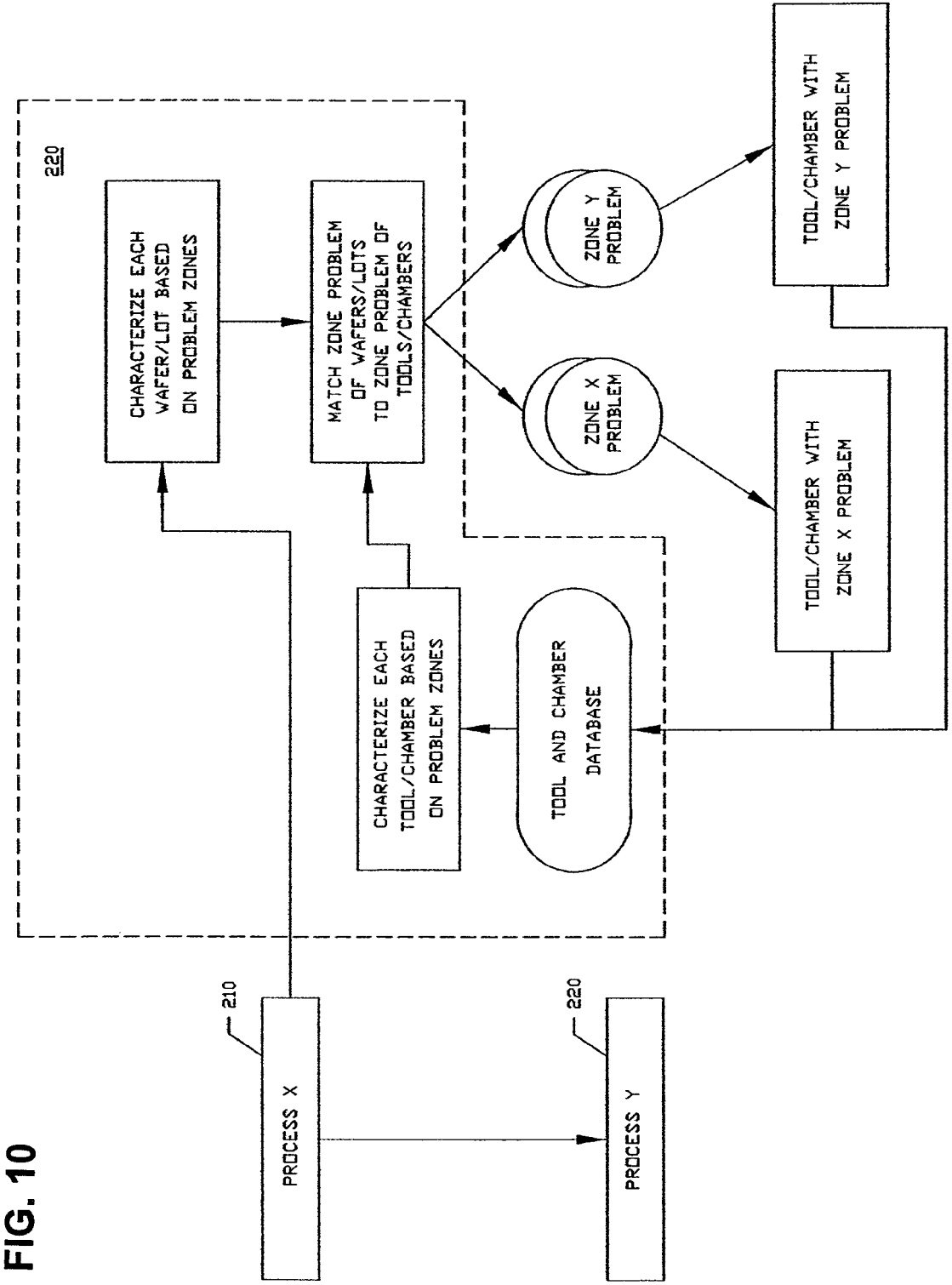
FIG. 10 shows another information system which can be utilized to determine the wafer processing route in accordance with the invention.

FIG. 10 illustrates in detail process steps 210 and 220 (the devices/steps arranged within the dashed line represents the various devices/steps which take place in process step 220) of FIG. 9. This figure shows how the exemplary upstream processing data obtained after step 210 of FIG. 9 is organized in a database which characterizes each wafer or wafer lots based on problem zones in the wafers. Step 220 utilizes a database which can store, among other things, data about the wafers/lots obtained before being processed in step 220 and which compares this data to stored process control data so that this database can characterize each wafer lot based on problem zones, i.e., zone yield data. This data is forwarded to a module which matches zone problems of the wafers and wafer lots to tools producing wafers having corresponding zone problems.

Again with reference to FIG. 10, step 220 also utilizes a tool and chamber database which can store, among other things, yield data about the tools and chambers obtained. This data is preferably real-time data and/or the latest available data indicative of how the tool or chamber is processing the wafers relative to desired processing constraints, and is compared to stored process control data so that this database can produce and provide yield data for each tool and chamber. A module then characterizes each tool and/or chamber based on the data received from the tool and chamber database. Along with the data from the module which characterizes each wafer/lot based on zone yield data, this data is forwarded to a module which matches wafers or wafers lots to each tool or chamber. The wafers or wafer lots are matched as follows; wafers or wafer lots determined to have zone problem X are identified so that they can be forwarded to a tool known to produce wafers with zone X problems, and the wafers or wafer lots determined to have zone Y problems are identified so that they can be forwarded to a tool known to produce wafers with a zone Y problem. In this way, the overall yield of the wafers will increase because the wafers are automatically routed in a manner which matches zone problem wafers to similar zone problem tools/chambers such that wafers with zone X problems do not result in wafers having both X and Y zone problems because they were processed with tools which produce both types of zone problems.

Figure 11:
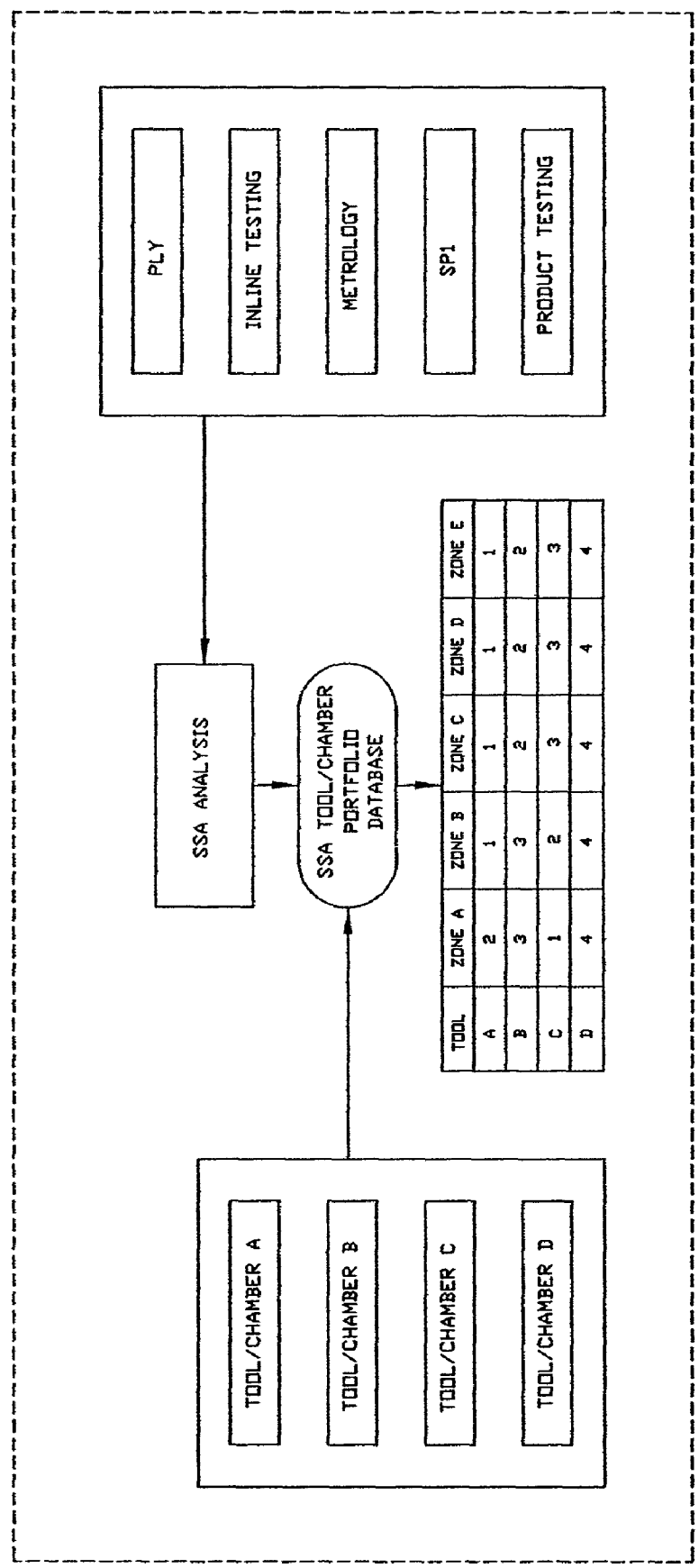
FIG. 11 shows still another information system which can be utilized to determine the wafer processing route in accordance with the invention.

FIG. 11 illustrates an optional system configuration which can be utilized in accordance with the invention. The system can utilize a spatial signature analysis database which stores tool processing data from tools A-D for various zones of a wafer and which stores tool processing data from the zones of the wafers or wafer lots processed by the tools A-D. Before this latter data is stored, it can be analyzed by a spatial signature analysis system. The database can then organize the data from the tools A-D and the wafers processed by the tools A-D and generate a table which describes what happens to the various zones of the wafers in tools A-D. This information can then be used in the processes of, e.g., FIGS. 6 and 9, to match wafers from the tools of upstream process steps to the tools of downstream process steps. In this way, the overall yield of the wafers by zone will increase because the wafers are automatically routed in a manner which matches zone problem wafers to similar zone problem tools/chambers.

The invention can be particular advantageous in semiconductor manufacturing, particularly at the 65 nm technology node and beyond where AMC is projected by the 2007 International Technology Roadmap for Semiconductors (ITRS) to be a potential yield limiter. Any manufacturing process where process queue times result in product degradation to exposure to uncontrolled environment can also benefit from the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for increasing overall yield in semiconductor manufacturing comprising:
    obtaining process variation data for a first zone of wafers or wafer lots;
    obtaining process variation data for a second zone of the wafers or wafer lots;
    obtaining process variation data for each tool of a plurality of tools relating to processing in the first zone and the second zone for wafers or wafer lots that were already processed on each tool;
    comparing the process variation data of the each tool to the process variation data for the first zone and the second zone of the wafers or wafer lots;
    selecting a tool from the plurality of tools to process the wafer or wafer lots based on whether the tool has process variation data for a same zone of the wafers or wafer lots that were already processed on the tool that is substantially similar to the process variation data of the first zone or the second zone of the wafers or wafer lots; and
    routing the wafers or wafer lots to the selected tool.

2. The method of claim 1, wherein the wafers or wafer lots comprise first wafers or wafer lots having at least one first yield characteristic and second wafers or wafer lots having at least one second yield characteristic, and wherein the method further comprises at least one of:
    routing the first wafers or wafer lots through a lower yield process route than the second wafers or lots; and
    routing the first wafers or wafer lots through a higher yield process route than the second wafers or lots.

3. The method of claim 1, further comprising:
    recording the process variation data for the plurality of tools; and
    determining where to send the wafers or wafer lots based on the recording.

4. The method of claim 1, further comprising:
    recording the process variation data for the first zone and the second zone of the wafers or wafer lots; and
    determining where to send the wafers or wafer lots based on the recording.

5. The method of claim 1, further comprising at least one of:
    recording in a database the process variation data for the plurality of tools and determining where to send the wafers or wafer lots based on information recorded in the database; and
    recording in a database the process variation data for the first zone and the second zone of the wafers or wafer lots and determining where to send the wafers or wafer lots based on information recorded in the database.

6. The method of claim 1, further comprising:
    recording in a database in real-time the process variation data for the plurality of tools; and
    determining where to send the wafers or wafer lots based on information recorded in the database.

7. The method of claim 1, further comprising:
    recording in a database in real-time the process variation data for the first zone and the second zone of the wafers or wafer lots; and
    determining where to send the wafers or wafer lots based on information recorded in the database.

8. The method of claim 1, further comprising:
    comparing process variation data for plural upstream tools to process variation data for plural downstream tools; and
    determining where to send the wafers or wafer lots from one of the plural upstream tools to one of the downstream tools based on the comparing.

9. The method of claim 8, further comprising at least one of:
    selecting the one of the downstream tools based on the determining; and
    transferring the wafers or wafer lots to the one of the downstream tools based on the selecting.

10. The method of claim 1, further comprising:
    comparing the process variation data for the first zone and the second zone of the wafers or wafer lots to process variation data of a plurality downstream tools; and
    transferring the wafers or wafer lots to one of the plurality of downstream tools based on the comparing.

11. The method of claim 1, further comprising:
    comparing process variation data of each of a plurality of predetermined downstream tools to the process variation data for the first zone and the second zone of the wafers or wafer lots processed by at least one of a plurality upstream tools; and transferring the wafers or wafer lots to one of the plurality of downstream tools based on the comparing.

12. The method of claim 1, further comprising:
comparing process variation data of each of a plurality of predetermined downstream tools to the process variation data for the first zone and the second zone of the wafers or wafer lots which are yet to be processed by the plurality of predetermined downstream tools;
selecting the one of the plurality of downstream tools based on the comparing; and
transferring the wafers or wafer lots to the one of the plurality of downstream tools based on the selecting.

13. The method of claim 1, further comprising at least one of:
transferring the wafers or wafer lots from at least one tool producing at least one process variation that is greater than a desired or predetermined processing value or range to another tool producing at least one process variation that is greater than a desired or predetermined processing value or range; and
transferring the wafers or wafer lots from at least one tool producing at least one process variation that is lesser than a desired or predetermined processing value or range to another tool producing at least one process variation that is lesser than a desired or predetermined processing value or range.

14. The method of claim 1, further comprising at least one of:
transferring the wafers or wafer lots from at least one tool which removes more material than is desired or required in at least one zone of the wafers to a tool which removes more material than is desired or required in at least one zone of the wafers;
transferring the wafers or wafer lots from at least one tool which removes less material than is desired or required in at least one zone of the wafers to a tool which removes less material than is desired or required in at least one zone of the wafers;
transferring the wafers or wafer lots from at least one tool which adds more material than is desired or required in at least one zone of the wafers to a tool which adds more material than is desired or required in at least one zone of the wafers; and
transferring the wafers or wafer lots from at least one tool which adds less material than is desired or required in at least one zone of the wafers to a tool which adds less material than is desired or required in at least one zone of the wafers.

15. The method of claim 1, further comprising:
recording in a database the process variation data from the plurality of tools; and
at least one of:
transferring the wafers or wafer lots from at least one tool producing at least one processing variation that is greater than a desired processing value or range to another tool producing at least one process variation that is greater than a desired processing value or range; and
transferring the wafers or wafer lots from at least one tool producing at least one process variation that is lesser than a desired processing value or range to another tool producing at least one process variation that is lesser than a desired processing value or range.

16. The method of claim 1, wherein the process variation data for the same zone of the wafers or wafer lots that were already processed on the tool is substantially similar to the process variation data for the first zone or the second zone of the wafers or wafer lots based on whether the process variation data for the same zone of the wafers or wafer lots that were already processed on the tool is greater than, lesser than, or indicative of a desired predetermined processing value or range and the process variation data for the first zone or the second zone of the wafers or wafer lots is also greater than, less than, or indicative of the desired predetermined processing value.

17. The method of claim 16, wherein the selecting the tool comprises determining whether the process variation data for the first zone or the second zone of the wafers or wafer lots is substantially similar to the process variation data for the same zone of the wafers or wafer lots that were already processed on the tool.

18. The method of claim 17, wherein:
the selected tool of the plurality of tools is a downstream tool of the plurality of tools;
the process variation data for the same zone of the wafers or wafer lots that were already processed on the selected tool is greater than, less than, or indicative of a desired predetermined processing value or range; and
the process variation data for the first zone or the second zone of the wafers or wafer lots is also greater than, less, than or indicative of the desired predetermined processing value or range.

19. A system for increasing overall yield in semiconductor manufacturing comprising:
a central processing unit (CPU) and a storage medium; and
first program code for obtaining process variation data for a first zone of wafers or wafer lots;
second program code for obtaining process variation data for a second zone of the wafers or wafer lots;
third program code for obtaining process variation data for each tool of a plurality of tools relating to processing in the first zone and the second zone for wafers or wafer lots that were already processed on each tool;
fourth program code for comparing the process variation data of the each tool to the process variation data for the first zone and the second zone of the wafers or wafer lots;
fifth program code for selecting a tool from the plurality of tools to process the wafer or wafer lots based on whether the tool has process variation data for a same zone of the wafers or wafers lots that were already processed on the tool that is substantially similar to the process variation data of the first zone or the second zone of the wafers or wafer lots; and
sixth program code for routing the wafers or wafer lots to the selected tool,
wherein the first-sixth program code is tangibly embodied on the storage medium and processed on the CPU.

20. The system of claim 19, wherein the wafers or wafer lots comprise first wafers or wafer lots having the at least one first yield characteristic and second wafers or wafer lots having the at least one second yield characteristic, and wherein the CPU at least one of:
routes the first wafers or wafer lots through a lower yield process route than the second wafers or lots; and
routes the first wafers or wafer lots through a higher yield process route than the second wafers or lots.

21. A method for increasing overall yield in semiconductor manufacturing comprising:
obtaining process variation data for a first zone of wafers or wafer lots;
obtaining process variation data for a second zone of the wafers or wafer lots;
obtaining process variation data for each tool of a plurality of tools relating to processing of the first zone and the second zone of a plurality of wafers or wafer lots that were already processed by each tool;

comparing the process variation data for each tool to the process variation data for the first zone and the second zone of the wafers or wafer lots;

transferring the wafers or wafer lots having process variation data for the first zone or the second zone that is greater than a desired predetermined processing value or range from at least one upstream tool of the plurality of tools having process variation data for a same zone of the plurality of wafers that is greater than a desired or predetermined processing value or range to at least one downstream tool of the plurality of tools having process variation that is greater than a desired or predetermined processing value or range;

transferring the wafers or wafer lots having process variation data for the first zone or the second zone that is less than a desired predetermined processing value or range from at least one upstream tool of the plurality of tools having process variation data for a same zone of the plurality of wafers that is less than a desired or predetermined processing value or range to at least one downstream tool of the plurality of tools having process variation that is greater than a desired or predetermined processing value or range; and transferring the wafers or wafer lots having process variation data for the first zone or the second zone that is indicative of a desired predetermined processing value or range from at least one upstream tool of the plurality of tools having process variation data for a same zone of the plurality of wafers that is indicative of a desired or predetermined processing value or range to at least one downstream tool of the plurality of tools having process variation that is indicative of a desired or predetermined processing value or range.

22. The method of claim 21, further comprising selecting at least one downstream tool of the plurality of tools having process variation that is greater than a desired or predetermined processing value or range, the at least one downstream tool of the plurality of tools having process variation data that is greater than a desired or predetermined processing value or range, and the at least one downstream tool of the plurality of tools having process variation data that is indicative of a desired or predetermined processing value or range to process the wafer or wafer lots is based on whether the at least one downstream tool comes substantially close to processing the at least one of first zone and the second zone of the plurality of wafers or wafer lots in a similar manner to the process variation data obtained for the first zone and the second zone of the wafer or wafer lots.

23. The method of claim 22, wherein:
the first zone and the second zone of the wafers or wafer lots are analyzed using a spatial analysis system to obtain topological data related to the first zone and the second zone; and
the topological data obtained from the spatial analysis is stored in a database and used for the selection of the at least one downstream tool.

* * * * *